(12) United States Patent
Carmon

(10) Patent No.: US 9,075,104 B2
(45) Date of Patent: Jul. 7, 2015

(54) CHIP INSTRUMENTATION FOR IN-SITU CLOCK DOMAIN CHARACTERIZATION

(71) Applicant: Broadcom Corporation, Irvine, CA (US)

(72) Inventor: Rafael Carmon, Rishon Lezion (IL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/927,836

(22) Filed: Jun. 26, 2013

(65) Prior Publication Data

US 2014/0354341 A1     Dec. 4, 2014

Related U.S. Application Data

(60) Provisional application No. 61/829,915, filed on May 31, 2013.

(51) Int. Cl.
G06F 1/04     (2006.01)
G01R 31/28    (2006.01)

(52) U.S. Cl.
CPC .................................. *G01R 31/2851* (2013.01)

(58) Field of Classification Search
CPC ............ G06F 1/08; G06F 1/10; G01R 31/317
USPC .................... 327/291, 298, 299; 377/113, 122
See application file for complete search history.

(56) References Cited

U.S. PATENT DOCUMENTS 7,239,188 B1 *   7/2007   Xu et al. .................... 327/156
8,354,857 B1 *   1/2013   Rosen ...................... 324/762.01

* cited by examiner

*Primary Examiner* — John Poos
(74) *Attorney, Agent, or Firm* — Sterne, Kessler, Goldstein & Fox P.L.L.C.

(57) ABSTRACT

Chip instrumentation determines, in-situ, an allowable increase over product specification in the operating frequency of at least one clock domain in an integrated circuit for a given set of environmental, power supply and/or functionality constraints. Information on the allowable increase in operating frequency for the at least one clock domain is provided to circuits and/or software to effect change in operating frequency.

12 Claims, 5 Drawing Sheets

CHIP INSTRUMENTATION FOR IN-SITU CLOCK DOMAIN CHARACTERIZATION

CROSS-REFERENCE TO RELATED APPLICATIONS

This nonprovisional application claims the benefit of U.S. Provisional Application 61/829,915, filed 31 May 2013, titled "Chip Instrumentation For In-Situ Clock Domain Characterization," the entirety of which is hereby incorporated by reference.

FIELD OF THE INVENTION

The present disclosure relates generally to integrated circuits, and more particularly to the determination of operating speeds of integrated circuits and to the operation of those integrated circuits at the individually determined operating speeds.

BACKGROUND

Semiconductor manufacturing processes have advanced dramatically over the years in terms of producing smaller and faster circuit elements such as transistors as well as interconnections between transistors. These smaller and faster circuit elements enable the design and production of chips with higher operating speeds than was possible with chips manufactured with previous generations of semiconductor manufacturing processes.

Chips with the ability to operate at high speeds have led to products that create and communicate vast amounts of data. In turn, the need to process, store, retrieve, transfer and communicate large amounts of data creates a general need for chips to operate on the data as fast as possible.

Semiconductor manufacturing processes are designed to produce chips where the electrical characteristics of the circuit elements have a nominal value. But, it is well known that in any given semiconductor manufacturing process that there is variability in each of the manufacturing steps. This variability results in a distribution of values for the various electrical characteristics of the circuit elements. Chip designers often take the distribution of values into account by designing for a set of electrical characteristics that are considered to be the worst-case. Designing in this way typically ensures that even if the variations in manufacturing produce a chip that is "slow," the chip will still operate fast enough to meet its specifications. This design methodology also typically ensures that when the variations in the manufacturing process produce a chip that is "fast," the chip is typically capable of operating faster than its specification requires.

That semiconductor manufacturing processes produce a distribution of parts having different operating speed capabilities is well known. Manufacturers often test newly manufactured chips not just to determine whether these chips are functional, but to further determine how fast they can operate. Functional chips that operate in different speed ranges can be sorted out during testing—a process referred to as binning—and the higher speed chips are then typically sold for a premium.

Unfortunately, as chips have become increasingly more complex, testing and binning have become more complex. Complexity in testing increases the cost of producing chips.

BRIEF DESCRIPTION OF THE DRAWINGS

Embodiments are described with reference to the accompanying drawings. In the drawings, like reference numbers indicate identical or functionally similar elements. Additionally, the left most digit(s) of a reference number identifies the drawing in which the reference number first appears.

Figure 1:
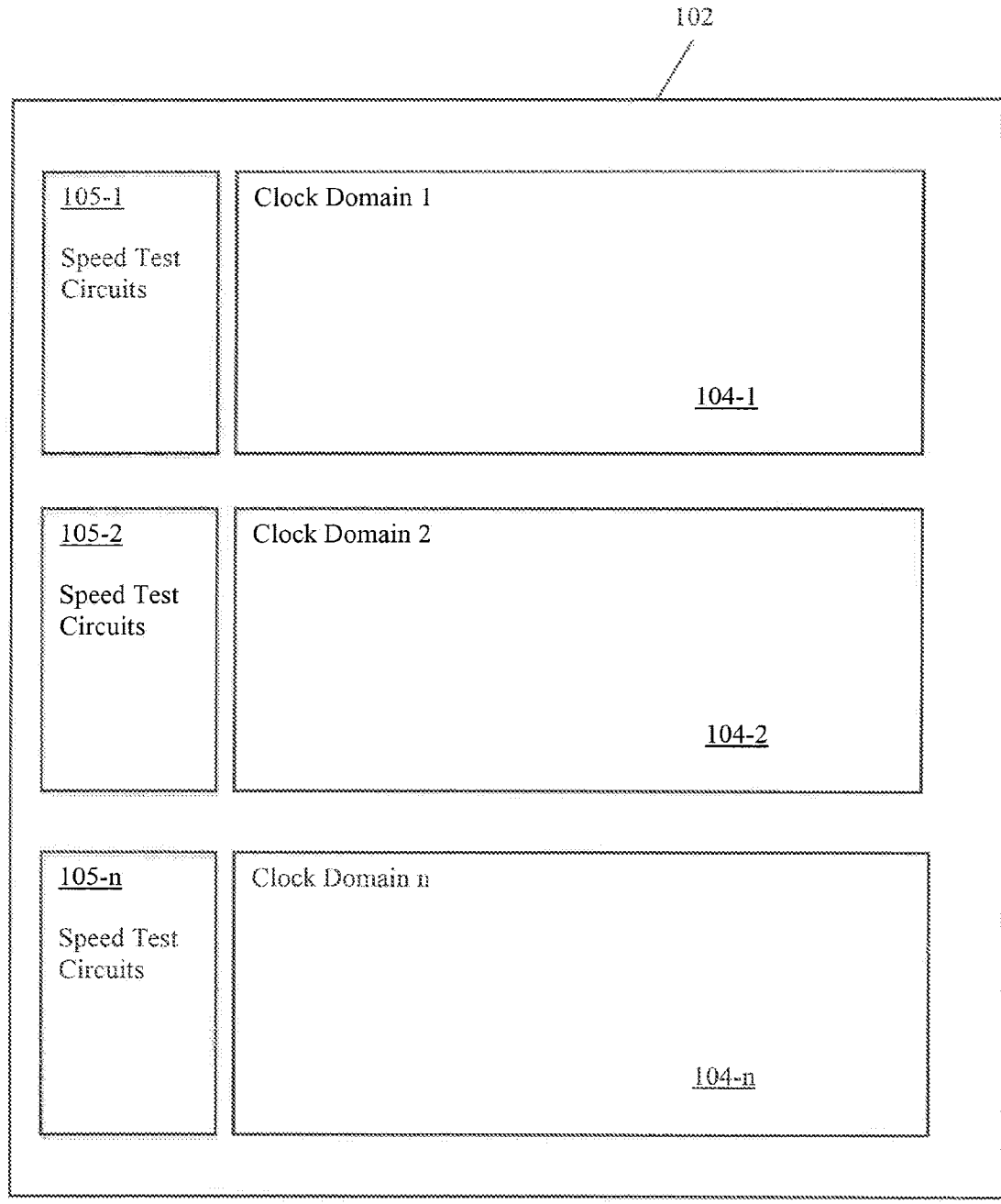
FIG. 1 is a high level block diagram of a chip having multiple clock domains and multiple speed test blocks.

The figures illustrate various components, their arrangements, and interconnections. Unless expressly stated to the contrary, the figures are not necessarily drawn to scale.

DETAILED DESCRIPTION

The following Detailed Description refers to the accompanying drawings to illustrate exemplary embodiments. References in the Detailed Description to "one exemplary embodiment," "an illustrative embodiment," "an exemplary embodiment," and so on, indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure.

The following Detailed Description of the exemplary embodiments will so fully reveal their general nature that, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

TERMINOLOGY

The terms, chip, die, integrated circuit, semiconductor device, and microelectronic device, are often used interchangeably in the field of electronics. The present disclosure is applicable to all the above as these terms are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, such as aluminum (Al), copper (Cu), an alloy of Al and Cu, an alloy of Al, Cu and silicon (Si), tungsten (W), and nickel (Ni) are examples of conductors that may provide signal paths for coupling or interconnecting, electrical circuitry. Other conductors, both metal and non-metal are available in microelectronic devices. Materials such as gold, cobalt, doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors. This list of conductors is exemplary and is not intended to be exhaustive.

FET, as used herein, refers to metal-oxide-semiconductor field effect transistors (MOSFETs). An n-channel FET is referred to herein as an NFET. A p-channel FET is referred to herein as a PFET.

As used herein, "gate" refers to the insulated gate terminal of a FET.

Source/drain (S/D) terminals refer to the terminals of a FET, between which conduction occurs under the influence of an electric field, subsequent to the inversion of the semiconductor surface under the influence of an electric field resulting from a voltage applied to the gate terminal of the FET. Generally, the source and drain terminals of a FET are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

The terms contact and via, both refer to structures for electrical connection of conductors from different levels of a chip. By way of example and not limitation, such electrical connections may be made between two metal lines on different interconnect levels of a chip, between a polysilicon line and a metal line, between a S/D junction and a metal line, and so on. These terms are sometimes used in the art to describe both an opening in an insulator in which the structure will be completed, and the completed structure itself. For purposes of this disclosure, contact and via both refer to the completed structure. Further, for purposes of this disclosure, contact refers to the structure used to form a connection between polysilicon or S/D junction and the first layer of metal; and via refers to the structure used to form a connection between metal layers.

RAM is an acronym for Random Access Memory. The most commonly used RAM circuits are volatile memories. Two common RAM types are static and dynamic. Many chips include static RAM circuits, dynamic RAM circuits, or both.

ROM is an acronym for Read Only Memory. ROMs are a non-volatile form of memory. Data is typically programmed into a ROM during the manufacturing process.

Substrate, as used herein, refers to the physical object that is the basic workpiece transformed by various process operations into the desired microelectronic configuration. A substrate may also be referred to as a wafer. Wafers, may be made of semiconducting, non-semiconducting, or combinations of semiconducting and non-semiconducting materials.

The term vertical, as used herein, means substantially perpendicular to the surface of a substrate.

As used herein, expressions such as operating speed, operating frequency, specified operating speed, base line speed, nominal speed, nominal operating frequency, and similar expressions are equivalent. In the case of digital circuits, these expressions all relate to the amount of time for one or more signals to propagate through a circuit path. The specification of a digital chip's operating speed, or frequency, is commonly based on the knowledge of two things: (1) the speed distribution over the range of manufacturing tolerances of the process in which the chip is fabricated, and (2) the smallest amount of time needed for one or more signals to propagate through a critical circuit path. The operating speed is then specified so that the critical path on chips at the slow end of the speed distribution still has enough time to function correctly.

It is noted that whenever this disclosure refers to producing or providing a particular voltage, it should be understood that in addition to that particular voltage, such an expression also includes a range of voltages within an error range that is tolerable for the proper operation of the circuit being discussed.

Overview

Various illustrative embodiments are described in which a chip is provided with the resources, typically circuitry, needed to determine whether one or more portions of the chip can be operated at a speed greater than the chip's nominally specified operational speed. In other illustrative embodiments, the chip may use that determination to dynamically adjust its operating speed. In still further embodiments, the chip provides information on its speed capabilities to a system within which it operates, and adjusts its operating speed in response to commands received from the system.

Successfully operating, as used herein, means operating at a frequency different from the nominal operating frequency without introducing errors into a chip's functionality.

FIG. 1 shows the generalized architecture of an exemplary chip. FIG. 1 is a high-level block diagram of a chip 102 that includes a plurality of clock domains 104-1, 104-2, . . . and 104-$n$. Exemplary chip 102 further includes a plurality of speed test circuits 105-1, 105-2, . . . and 105-$n$. In this generalized architecture, each clock domain 104 has an associated speed test block 105. In some embodiments, a single speed test block may be used for multiple clock domains.

Not all chips have multiple clock domains; rather some embodiments may have a single clock domain. It is noted that in embodiments with two or more clock domains, speed test circuits may be associated with one or more of those clock domains. That is, for chips with multiple clock domains, it is not required that every clock domain have speed test circuits associated therewith. As discussed in greater detail below, speed test circuits 105 may be based on critical circuit path modeling, or based on electrical parameter characterization.

In-Situ Speed Testing by Functional Failure

As noted above, various embodiments provide on-chip resources useful for determining whether the chip, or at least portions of the chip, may be successfully operated at a speed different than the chip's specified nominal operating speed. Inclusion of these on-chip resources may be referred to as instrumenting the chip. To improve the accuracy of the results provided by the on-chip resources, careful placement of the resources is helpful. For example, because electrical interference may occur in a localized manner, the on-chip resources should be disposed such that they are affected in substantially the same manner as the circuits for which the resources are used to determine an operating speed. Similarly, temperature, which affects transistor speed, is impacted not just by the environment of the chip as a whole, but also by localized heating. Localized heating on a chip is closely tied to both physical layout and to circuit operation. Thus placement of the "instrumentation" so as to experience the same localized heating is helpful in making the results obtained from the instrumentation as accurate as possible.

In some embodiments, a critical circuit path is duplicated on the chip. The duplicate critical circuit path is copied so that its electrical performance very closely, if not identically, matches the electrical performance of the actual critical circuit path. Matching may include copying the physical layout of the actual critical circuit path, including transistor types, transistor sizes, transistor biasing processes at the mask and/or wafer level, interconnect materials, contact and/or via structures, orientation, power and ground connections, and so on. The various levels of interconnect should have the same relationship vertically and laterally to all the other layers as the interconnect in the actual critical circuit path. Matching may further include exposing the duplicated critical circuit path to the same, or substantially the same, capacitive coupling interference (sometimes referred to as cross-talk). Further, matching may include placing the duplicate critical circuit path on the chip in a way that it is similarly exposed to process variations during manufacturing (e.g., oriented so as to be subject to misalignment errors in the same way that the actual critical circuit path is subject to misalignment errors).

There is no limitation on the type of circuitry that constitutes a critical circuit path. In many exemplary embodiments, the critical circuit path is made of logic gates. In other exemplary embodiments, the critical circuit path may be made of RAM or ROM circuits. In still other exemplary embodiments, various combinations of RAM, ROM or logic gates make up the critical paths.

The duplicated critical circuit path may be operated at speeds different from—typically faster than—the specified nominal operating speed. To determine the highest speed at which the critical circuit path of the chip can be successfully operated, the duplicated critical circuit path may be operated at increasingly higher speeds until a failure is detected. In this way, an upper limit on the operating speed of the actual critical circuit path is determined.

It is noted that the highest operating speed is less than the speed at which failure occurs. Further, the amount by which a new operating speed is less than the speed at which failure occurs can be selected in any suitable manner. By way of example and not limitation, a fixed amount less than the speed at which failure is detected may be used. Providing such margin is simply prudent engineering. Alternatively, the delta in operating speed from failure speed to highest successful operating speed may be scaled based on the difference between the nominal operating speed and the failure speed.

Once the highest successful operating speed is determined, information that represents, or defines, this speed can be provided to the system in which the chip operates and the system can make the decision as to whether the operating speed is to be changed. Alternatively, this information can be used internally by the chip to automatically change the operating speed.

The change in operating speed may be implemented by providing control information to the clock generation circuits of the chip, or to the clock generation circuits of a particular clock domain of the chip. In some embodiments, such control information may be used to modify the operation of the phase locked loop or the voltage controlled oscillator found in many clock generator designs. In this way, the in-situ speed test circuitry provides the information used by the clock generators on the chip to run the chip at a speed higher than that nominally specified for the chip.

In some embodiments, the on-chip resources may keep a history, or log, of the speed test results or of the changes in operating speed based on those speed test results. Such a history or log may be kept in any type of on-chip memory. By way of example and not limitation, the on-chip memory may be volatile or non-volatile.

In-Situ Speed Testing by Device Characterization

In some embodiments, circuitry that can produce one or more signals indicative of how fast the chip can successfully operate is included on the chip. Including such on-chip resources may be referred to as "instrumenting" the chip.

As noted above, the actual speed capability of an individual chip depends to some degree on a range of process variables that occur during manufacturing. Because of the variability in the manufacturing process, some chips are capable of operating at higher speeds than others. By identifying these capabilities, a system can exploit the ability of some of the chips to operate at speeds greater than the specified nominal operating speed. Further, since the operating speed of chips is typically affected by environmental factors, including but not limited to ambient temperature, air flow, heat sink design, packaging, and power supply voltage, it is advantageous to be able to dynamically determine the instantaneous operating speed capabilities of an individual chip.

In various exemplary embodiments, a ring oscillator disposed on a chip of interest is used to determine the speed characteristics of an individual chip. In one embodiment, the output of the ring oscillator is provided to a counter that counts the output pulses for a known period of time. The number of ring oscillator pulses counted in that fixed period of time can be used to determine the frequency of the ring oscillator. The counter may be co-located with the ring oscillator on the chip of interest, or it may be external to that chip. The frequency of the ring oscillator is related to the speed of the circuitry on the chip in general. For example, for a ring oscillator constructed of CMOS circuits, an indication of both the NFET and PFET drive currents is provided by the ring oscillator frequency. Those skilled in the art and having the benefit of this disclosure will recognize that various circuit configurations can be used to further determine body effect, which in turn informs the determination of the best operating speed for circuits with stacked FETs or active body bias.

Once the highest successful operating speed is determined, information that represents, or defines, this speed can be provided to the system in which the chip operates and the system can make the decision as to whether the operating speed is to be changed. Alternatively, this information can be used internally by the chip to automatically change the operating speed.

The ring oscillator frequency can be measured continuously, periodically, or on command from the system. The on-chip resources may keep a history, or log, of the speed test results or of the changes in operating speed based on those speed test results. Such a history or log may be kept in any type of on-chip memory. By way of example and not limitation, the on-chip memory may be volatile or non-volatile.

Figure 3:
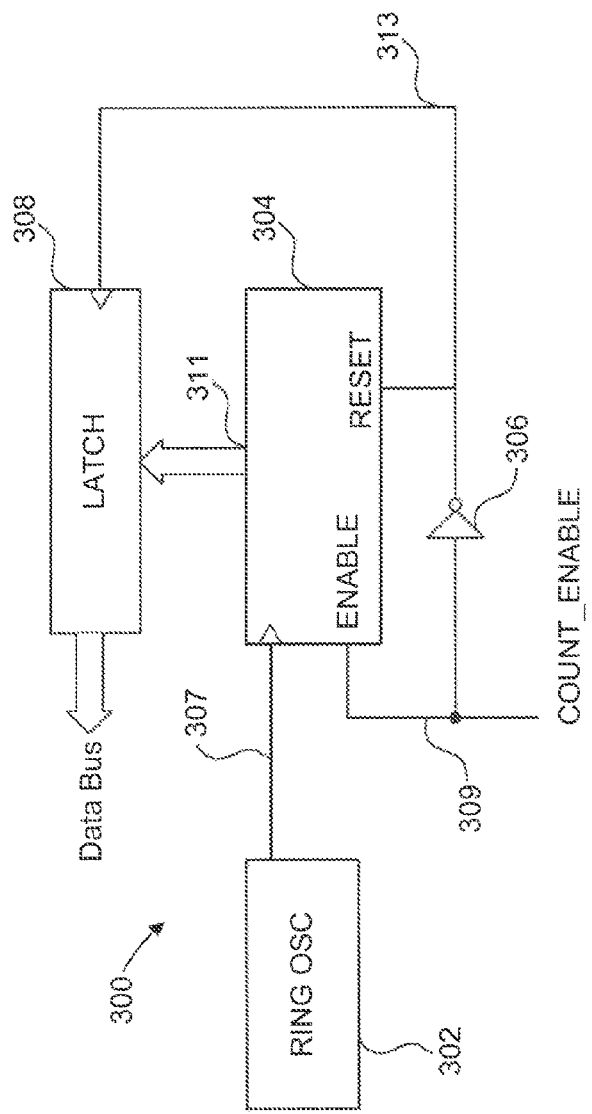
FIG. 3 is a schematic diagram of a circuit for measuring an unknown frequency for a known duration.

FIG. 3 shows circuitry 300 for measuring an unknown frequency for a known duration. If the circuits on the chip are "fast" the number of ring oscillator pulses counted will be greater than the number of ring oscillator pulses counted when the chip is "slow." Circuitry 300 includes a ring oscillator 302 coupled to a counter 304. Ring oscillator 302 has an output signal 307 that is connected to the clock input terminal of counter 304. In this exemplary embodiment, ring oscillator 302 is a free-running ring oscillator having an odd number of inverter stages coupled serially into a ring configuration. It is noted that ring oscillator designs are well-known, and embodiments herein are not limited to any particular implementation or design of the ring oscillator. Counter 304 has a counter output coupled to a latch 308. Counter 304 is further coupled to receive a count enable signal 309, and to receive a reset signal 313. Reset signal 313 is the logical inverse of count enable signal 309 and in this exemplary embodiment is generated by inverter 306 as shown in FIG. 3. Latch 308 is coupled to receive the counter output data 311 and latch it on the rising edge of reset signal 313. This embodiment provides sufficient set-up and hold time for the counter output data at the inputs of latch 308 that counter output data 311 is successfully latched on the rising edge of reset signal 313. Latch 308 is typically coupled to a data bus so that a multi-bit output can be read out of latch 308 and transferred to other circuitry for interpretation of the count value.

Figure 4:
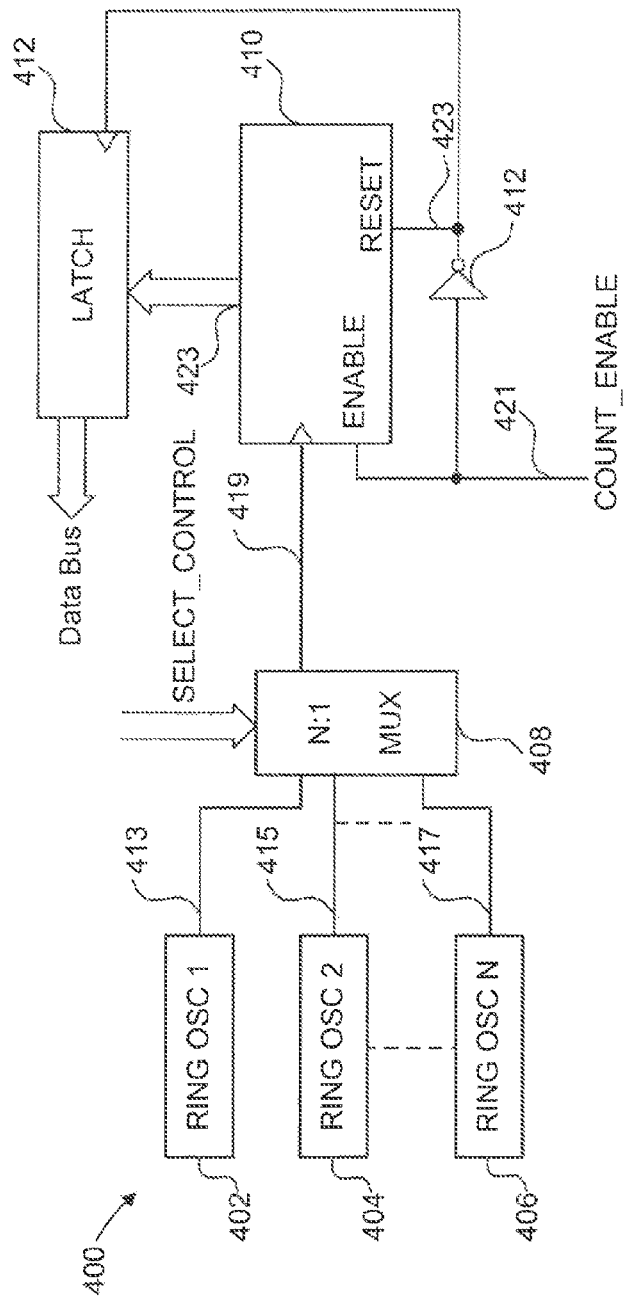
FIG. 4 is a schematic diagram of an alternative circuit for measuring an unknown frequency for a known duration.

FIG. 4 shows alternative circuitry 400 for measuring an unknown frequency for a known duration. Circuitry 400 that is similar to that shown in FIG. 3 but which enables finer granularity in determining the electrical characteristics of individual electrical circuit elements, for example, the differences between PFETs and NFETs in drive currents and leakage currents, contact resistance, interconnect resistance, and so on. Circuitry 400 includes a first ring oscillator 402, a second ring oscillator 404, and an Nth ring oscillator 406. Ring oscillators 402, 404, 406 each have an output, respectively 413, 415, 417 coupled to respective input terminals of an N:1 multiplexer 408. An output terminal of N:1 multiplexer 408 provides the selected signal to a clock input terminal of counter 410. Counter 410 is further coupled to a count enable signal 421 and a reset signal 423. Reset signal 423 is the logical inverse of counter enable signal 421 and it is generated by inverter 412. Counter output 423 is coupled to the input terminals of a latch 412. Latch 412 is configured to receive counter output data 423 and latch it on the rising edge of reset signal 423. This embodiment provides sufficient set-up and hold time for counter output data 423 at the inputs of latch 412 that counter output data 423 is successfully latched on the rising edge of reset signal 423. Latch 412 is typically coupled to a data bus so that a multi-bit output can be read out of latch 412 and transferred to other circuitry for interpretation of the count value. In this exemplary embodiment, each of ring oscillators 402 through 406 are implemented, as is known in the art, to make its free-running frequency predominantly dependent upon a specific set of one or more electrical elements, such as, but not limited to NFET drive current, PFET drive current, interconnect resistance, interconnect capacitance, and so on. In this way, by measuring the free-running frequencies of the variously implemented ring oscillators, a detailed picture of electrical device characteristics, all material to chip operating speed, are obtained.

Figure 5:
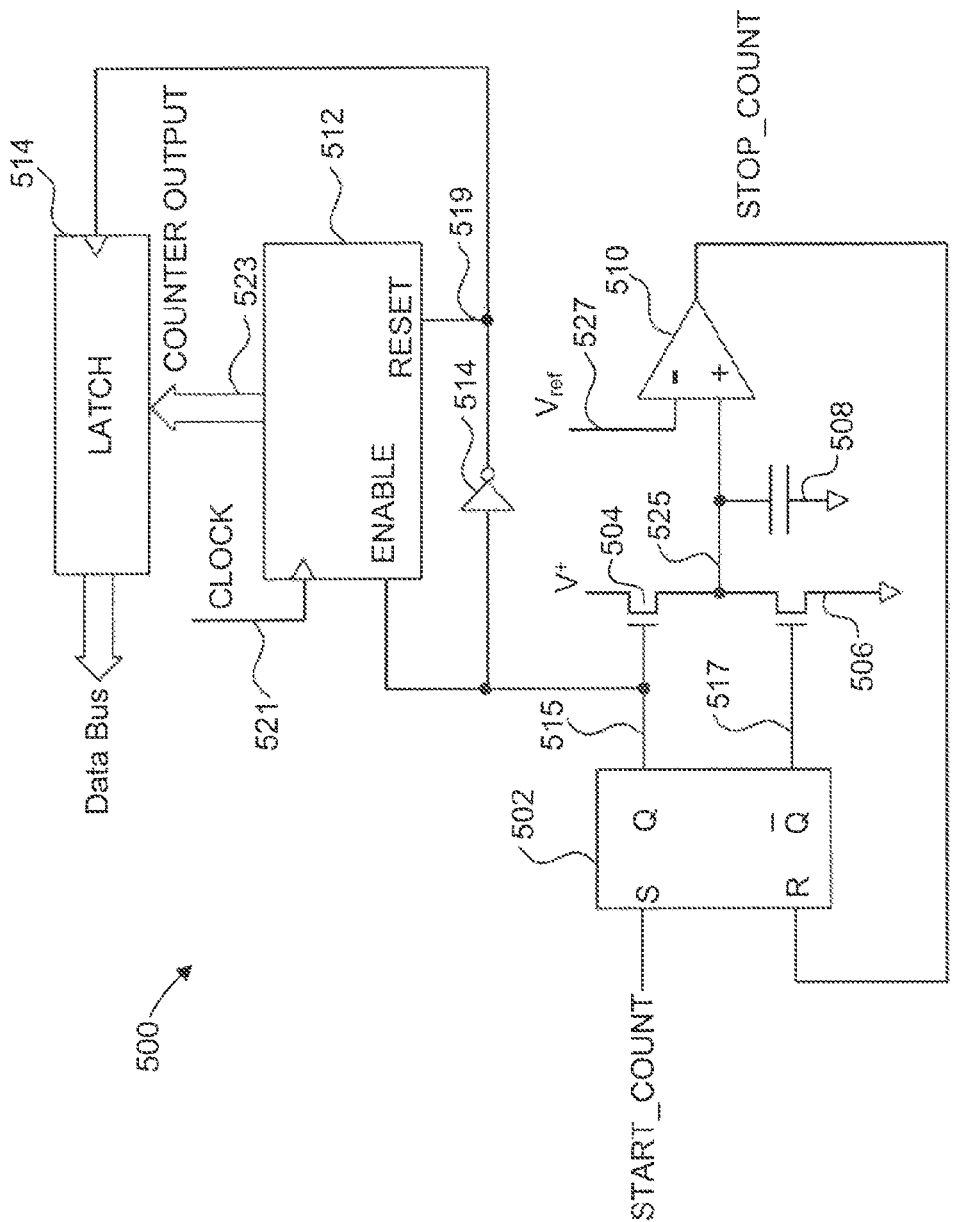
FIG. 5 is a schematic diagram of a circuit for measuring a known frequency for an unknown duration.

FIG. 5 shows circuitry 500 for measuring a known frequency for an unknown duration. Circuitry 500 uses a known time-base such as an externally supplied clock of a known frequency, and counts the clock pulses of that signal for an amount of time that depends on the electrical characteristics of the chip that are material to operating speed. In the exemplary embodiment of FIG. 5, the known clock signal is counted for the amount of time it takes to charge a capacitor. Circuitry 500 includes a set-reset flip-flip (SRFF) 502 that is configured to receive a start count signal at its set input terminal and a stop count signal at its reset input terminal. The Q and Qbar (logical inverse of Q) output terminals of SRFF 502 are coupled respectively to the gate terminals of NFET 504 and 506. NFET 504 is coupled drain-to-source between a positive voltage supply V+ and an intermediate node 525. NFET 506 is coupled drain-to-source between intermediate node 525 and ground. A capacitor 508 is coupled between intermediate node 525 and ground. A comparator 510 is used to determine when the voltage at intermediate node 525 exceeds the voltage of a reference signal Vref. A counter 512 begins counting clock signal 521 when the Q output of SRFF 502 goes high, and continues to count clock signal 521 until SRFF 502 is reset when the output of comparator 510 indicates that capacitor 508 has been charged. The counter output data 523 is transferred to latch 514 when the counting is terminated. By measuring the amount of time required to charge capacitor 508 to a predetermined voltage Vref, the operating speed of the chip can be determined. It is noted that this exemplary embodiment is primarily measuring the drive current of NFET 504. Those skilled in the art and having the benefit of this disclosure will understand that the charging circuit can be modified to measure PFET drive current, or to investigate interconnect resistance, contact resistance, and similar electrical characteristics that impact the operating speed of the chip.

The change in operating speed may be implemented by providing control information to the clock generation circuits of the chip, or to the clock generation circuits of a particular clock domain of the chip. Such control information can be used to modify the operation of the phase locked loop or the voltage controlled oscillator found in many clock generator designs. In this way, the in-situ speed test circuitry provides the information used by the clock generators on the chip to run the chip at a speed higher than that nominally specified for the chip.

Duty Cycle Awareness

The output of a ring oscillator may not have a 50% duty cycle. For a chip where performance depends to some degree on the duty cycle of a clock signal, the frequency of a ring oscillator output, by itself, may not be determinative of the highest operating speed for the circuitry that is sensitive to duty cycle. In such a case, knowledge of the circuitry on the chip is needed to correctly map the ring oscillator frequency to the highest successful operating speed. To implement such a feature, a table that stores the mapping of ring oscillator frequency ranges to chip operating speeds can be used.

Initiation of the Speed Testing Procedure

In various embodiments, the time or times at which speed testing is performed may differ. For example, in some embodiments a speed test may run continuously, whereas in other embodiments the speed test may run periodically, on command, or upon detection of a change in operating condition. The period for periodically running the speed test may be (1) fixed and set by the design of the chip; or (2) programmable by writing data into one or more on-chip registers that, in combination with on-chip speed test control circuits, determine the schedule of speed test events. Alternatively, the system within which the chip operates may transmit commands to the chip that instruct it to perform a speed test. In still other embodiments, the chip may detect a change in one or more of its operating conditions, and that detection acts as a trigger for initiating a speed test event. Such conditions may include, but are not limited to, (1) a change in junction temperature detected on chip; (2) a change in ambient temperature detected external to the chip and reported to the chip by external circuitry; (3) a change in one or more power supply voltages greater than a predetermined threshold amount; (4) detection of a power failure or reset event; (5) detection in a change in the mode of operation of the chip; or (6) a combination of two or more of items (1) through (5).

Speed Path in a Chip with Programmable Logic

In most chips, a critical speed path in each clock domain can be identified by the manufacturer or designer. Knowing the critical speed path in advance allows some embodiments to properly model the critical speed path by placing a duplicate of the critical speed path on the chip. But in certain chips, such as those with programmable logic, the critical speed path cannot be identified until the configuration of the programmable logic is established. Thus, for chips such as field programmable gate arrays (FPGAs), the critical speed path may not be known in advance. In some embodiments, FPGAs are provided with a sufficient supply of programmable logic resources so that both the desired logic configuration and a duplicate of the critical speed path can be implemented on the same chip. In other embodiments, rather than dedicate relatively expensive programmable logic resources to speed testing, circuitry suitable for characterizing the speed capabilities of the chip are employed as on-chip instrumentation. By measuring the electrical characteristics of the on-chip instrumentation circuits, the highest operating speed at which at least one clock domain of the chip can operate may be determined.

In some embodiments, the circuitry that makes measurements indicative of the speed performance of the FPGA communicates that information to external circuitry which, in turn, commands at least one clock domain within the FPGA to adjust its operating speed. In still other embodiments, the circuitry that makes measurements indicative of the speed performance of the FPGA directly communicates with the FPGA's on-chip clock circuitry to achieve a desired operating speed.

On-Chip Measurement of Speed-Related Characteristics

It will be appreciated that any suitable process- or operation-dependent parameter, or characteristic, may be measured on-chip and used, at least in part, as the basis for commanding, or requesting, changes to the operating speed of one or more clock domains within the chip. For example, the current-drive of p-channel and n-channel FETs may be determined separately so as to further refine the decision making process regarding changes to the operating speed. Similarly, the leakage of p-channel and n-channel FETs may be determined separately. Those skilled in the art and having the benefit of this disclosure will understand that many other measurements, including but not limited to, the resistivity of conductor materials, and the capacitance of various structures, may all be individually made, and these measurements factored into the generation of control signals that determine changes to the operating speed of at least one clock domain of the chip.

Illustrative Embodiments

In various alternative embodiments, in-situ speed testing circuitry may be distributed over two or more chips. For example, the chip for which speed testing is desired is instrumented as described above, but the determination logic resides on one or more other chips. The one or more other chips may be stacked with the chip of interest and electrical connection made by way of through silicon vias. Alternatively, the one or more other chips may be stacked and electrical connection made by way of bond wires. The one or more other chips may be individually packaged and connected by way of a printed circuit board. The one or more other chips may communicate with the chip of interest wirelessly. The one or more other chips may communicate with the chip of interest by way of photonic communication circuits. The foregoing exemplary arrangements are for illustration and not limitation. Those skilled in the art and having the benefit of the present disclosure will recognize that there may exist still further alternatives or combinations for the partitioning and connection of the in-situ speed testing circuitry. As long as the instrumentation includes at least some of the circuit elements disposed on the chip of interest, various portions of the determination logic and related non-measurement circuitry can be located in one or more other chips.

Output of Power Change Information

In one illustrative embodiment, a chip may provide information indicative of the change in power consumption associated with a change in operating speed. For example, if the chip determines that it is capable of successfully operating faster than its nominal operating speed, it also provides information indicating the magnitude of the change in power consumption that would be caused by making the corresponding change in operating speed. It is known that power consumption is proportional to $CV^2f$ where C is the capacitance that is being charged and discharged, V is the power supply voltage, and f is the frequency at which the capacitance is charged/discharged. But the in-situ speed testing circuitry may be implemented to incorporate specific factors in order to provide a more accurate estimate of the change in power consumption. For example, in a chip with multiple clock domains, the on-chip circuitry can account for the capacitance of, and regulated voltage delivered to, each of the clock domains of the chip where a change in operating speed is determined to be achievable. In this way, accurate information can be supplied to the system in which the chip operates, allowing trade-offs between power consumption and performance to be made with high resolution.

Reliability Reporting Embodiment

For some chips a downward trend in maximum operating speed may be indicative of an impending failure. In an exemplary embodiment, the chip records some or all changes in operating speed, recognizes the downward trend in operating speed as predictor of failure and reports this reliability issue to the system in which it operates. Recording of the changes may be accomplished by storing information in any type of on-chip storage.

In an alternative embodiment the chip reports the operating speed each time a change in operating speed takes place, and the system in which the chip operates is responsible for storing and/or processing this information to make a determination regarding the degradation in reliability of the chip. Reporting can take any suitable form, including but not limited to, (1) storing, within the chip, the information about operating speed changes and making that stored information accessible to external circuitry (i.e., a read operation by external circuitry); or (2) transmitting, by the chip, the information about operating speed changes to external circuitry (i.e., a write operation by the chip).

In a further alternative embodiment, the chip reports additional information with its reports of operating speed change. For example, the chip may additionally, and concurrently, report information indicative of junction temperature on the chip. Since junction temperature affects operating speed, this information is relevant to a determination of whether the change in operating speed is indicative of a reliability issue with the chip. Reporting of junction temperature is illustrative and not limiting. Any one or more physical parameters may be reported by the chip along with the information about operating speed changes.

Open Loop Embodiment

In an exemplary "open loop" embodiment, a chip is continuously tested, typically by means of firmware, at gradually increasing speeds until failure in an open loop fashion occurs. The operating speed just prior to the failure can then be used as the new operating speed of the chip. This advantageously allows the operating speed of the chip to be dynamically set to run at the highest speeds possible under the constraints of the chip's environment (e.g., junction temperature and power supply voltage), and the chip's inherent speed capabilities based on the distribution of variances in the semiconductor manufacturing process.

Open loop embodiments typically require resetting the chip after a failure occurs. Resetting may interfere with retaining the information defining the highest speed at which the chip can properly operate, and thus may require interaction with external components, or introduce a requirement for non-volatile memory on the chip. Also, the process of resetting may incur time penalties related to the internal reset process of the chip and/or the impact to the system in which the chip is operating.

Dedicated Test Hardware Embodiment

In this exemplary embodiment, dedicated hardware is included on the chip that is used to test the chip to determine the highest possible speed of operation that can be achieved without error or failure. In this embodiment, the operating speed is gradually increased until a failure occurs. The operating speed just prior to the operating speed at which the failure occurred can then be used going forward as the new operating speed. This advantageously allows the operating speed of the chip to be dynamically set to run at the highest speeds possible under the constraints of the chip's environment (e.g., junction temperature and power supply voltage), and the chip's inherent speed capabilities based on the distribution of variances in the semiconductor manufacturing process.

It is noted that the on-chip speed testing circuitry may be configured to include the impact of localized self-heating in each of the affected clock domains on leakage current in order to provide a more accurate estimate of the change in power consumption.

In one embodiment, the information indicative of the change in power consumption of the chip may be in the form of a bit pattern stored in a register that is accessible to other circuitry external to the chip. Some illustrative embodiments may be configured to make the bit pattern accessible serially. Other illustrative embodiments may be configured to make the bit pattern accessible in parallel. These embodiments are exemplary and not limiting, and any suitable data format or circuit arrangement in connection with communication of the power change information may be used.

Figure 2:
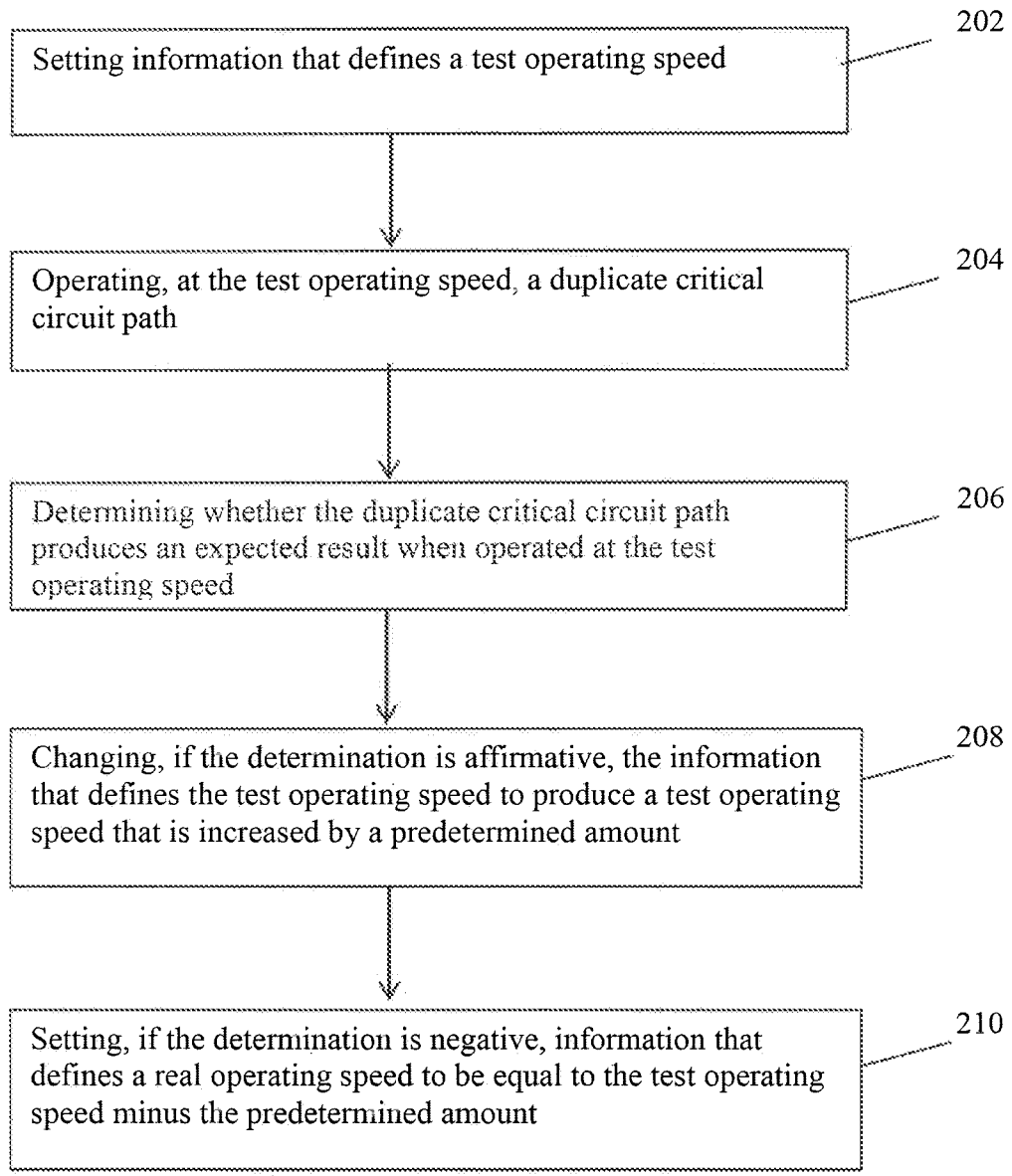
FIG. 2 is a flow diagram of a method of determining an operating speed different than a nominally specified operating speed for a chip.

FIG. 2 illustrates a method of providing information indicative of an operating speed for a clock domain on a chip, includes (a) setting 202, on the chip, information that defines a test operating speed; (b) operating 204, at the test operating speed, a duplicate critical circuit path; (c) determining 206 whether the duplicate critical circuit path produces an expected result when operated at the test operating speed; (d) changing 208, if the determination of operation (c) is affirmative, the information that defines the test operating speed to produce a test operating speed that is increased by a predetermined amount; and (e) setting 210, if the determination of operation (c) is negative, information that defines a real operating speed to be equal to the test operating speed minus the predetermined amount; wherein the duplicate critical circuit path matches the physical and electrical characteristics of an actual critical circuit path in the clock domain. Setting the information may be accomplished in any suitable manner, such as for example loading the information into a register on the chip. An expected result is typically represented by the a circuit under test produced the result that it was designed to produce given the input signals and voltages applied to it. When a circuit is tested, it is operated and if it produces the expected result, it is said to have "passed," the test. The predetermined amount of change in operating speed may be selected by the chip designer based on the resolution that is desired in obtaining the highest possible operating speeds. Smaller predetermined amounts require more cycles of testing and comparing but more closely approach the operating speed limit. On the other hand, larger predetermined amounts will more quickly reach a highest operating speed but it will be lower than that determined by the smaller predetermined amounts. In other words, the finer resolution of small steps takes longer but gives better results. It is possible to use a combination of large and small steps, in a manner analogous to coarse and fine tuning. In other embodiments, the illustrative method may further include, subsequent to performing operation (d), performing operation (b). In other embodiments, the illustrative method may further include, subsequent to performing operation (e), storing information indicative of the value of the real operating speed. In still other embodiments, the illustrative method may further include outputting the stored information indicative of the value of the real operating speed. It is noted that further embodiments may include selecting the duplicate critical circuit path from a plurality of duplicate critical circuit paths. And selecting the duplicate critical circuit path from a plurality of duplicate critical circuit paths may include receiving, at the chip, information specifying which one of the plurality of duplicate critical circuit paths to select; or may include determining, at the chip, which one of a plurality of actual critical paths is in use by the chip.

In another illustrative embodiment, a method of providing information indicative of the operating speed range on a chip, includes (a) operating speed characterization circuitry disposed on the chip; (b) determining, based at least in part on the operation of the speed characterization circuitry, a first operating speed for at least a portion of the chip, the first operating speed being different than a nominally specified operating speed; (c) generating information representative of the first operating speed; and (d) using the information in an on-chip clock generator to operate at least a portion of the chip at the first operating speed.

CONCLUSION

It is to be appreciated that the Detailed Description section, and not the Abstract of the Disclosure, is intended to be used to interpret the claims. The Abstract of the Disclosure may set forth one or more, but not all, exemplary embodiments, and thus, is not intended to limit the subjoined Claims in any way.

It will be apparent to those skilled in the relevant art(s) that various changes in form and detail can be made therein without departing from the spirit and scope of the d. Thus the invention should not be limited by any of the above-described exemplary embodiments, but should be defined only in accordance with the subjoined Claims and their equivalents.

What is claimed is:

1. A method of providing information indicative of an operating speed for a clock domain on a chip, comprising:
    setting, on the chip, information that defines a test operating speed;
    operating, at the test operating speed, a duplicate critical circuit path;
    determining whether the duplicate critical circuit path produces an expected result when operated at the test operating speed;
    changing, if the determination is affirmative, the information that defines the test operating speed to produce an increased test operating speed that is increased by a predetermined amount; and
    setting, if the determination is negative, information that defines a real operating speed to be equal to the increased test operating speed minus the predetermined amount;
    wherein the duplicate critical circuit path matches physical and electrical characteristics of an actual critical circuit path in the clock domain.

2. The method of claim 1, further comprising:
subsequent to changing, determining whether the duplicate critical circuit path produces the expected result when operated at the test operating speed.

3. The method of claim 1, further comprising:
subsequent to setting information that defines the real operating speed to be equal to the test operating speed minus the predetermined amount, storing the information.

4. The method of claim 3, further comprising:
outputting the stored information indicative of the value of the real operating speed.

5. The method of claim 1, further comprising:
selecting the duplicate critical circuit path from a plurality of duplicate critical circuit paths.

6. The method of claim 5, wherein selecting the duplicate critical circuit path from the plurality of duplicate critical circuit paths comprises:
receiving, at the chip, information specifying which one of the plurality of duplicate critical circuit paths to select.

7. The method of claim 5, wherein selecting the duplicate critical circuit path from the plurality of duplicate critical circuit paths comprises:
determining, at the chip, which one of a plurality of actual critical paths is in use by the chip.

8. A method of providing information indicative of an operating speed range on a chip, comprising:
operating speed characterization circuitry disposed on the chip;
determining, based at least in part on the operation of the speed characterization circuitry, a first operating speed for at least a portion of the chip, the first operating speed being different than a nominally specified operating speed;
generating information representative of the first operating speed; and
using the information in an on-chip clock generator to operate at least a portion of the chip at the first operating speed;
wherein operating the speed characterization circuitry includes operating a first ring oscillator to generate a first signal having a frequency predominantly dependent on a first electrical characteristic of the first ring oscillator, and operating a second ring oscillator to generate a second signal having a frequency predominantly dependent on a second electrical characteristic of the second ring oscillator.

9. The method of claim 8, wherein generating the information representative of the first operating speed comprises accessing a table containing a mapping of ring oscillator frequencies to operating speeds.

10. An integrated circuit, comprising:
a clock domain;
a clock generator coupled to the clock domain and configured to generate a clock signal having a frequency; and
a speed test circuit configured to provide one or more outputs indicative of an operating speed range of the clock domain;
wherein the clock generator is configured to change the frequency of the clock signal based at least in part on the one or more outputs of the speed test circuit;
wherein the speed test circuit comprises:
a number N of ring oscillators;
an N:1 multiplexer coupled to an output signal of each of the N ring oscillators; and
a counter coupled to an output of the N:1 multiplexer;
wherein the N ring oscillators each generate a signal having a frequency indicative of the operating speed range of the clock domain;
wherein the counter is configured to be enabled for counting for a predetermined amount of time; and
wherein at least two of the N ring oscillators are configured to generate a signal having a frequency that is predominantly dependent on a different electrical parameter.

11. The integrated circuit of claim 10, wherein the speed test circuit comprises a duplicate of a critical circuit path in the clock domain.

12. A method of providing information indicative of an operating speed for a clock domain on a chip, comprising:
setting, on the chip, information that defines a test operating speed;
operating, at the test operating speed, a duplicate critical circuit path;
determining whether the duplicate critical circuit path produces an expected result when operated at the test operating speed;
increasing, if the determination is affirmative, the test operating speed; and
decreasing, if the determination is negative, the test operating speed;
wherein the duplicate critical circuit path matches physical and electrical characteristics of an actual critical circuit path in the clock domain.

\* \* \* \* \*